(12) United States Patent
Sugahara

(10) Patent No.: US 9,545,015 B2
(45) Date of Patent: Jan. 10, 2017

(54) METHOD FOR CONNECTING TWO OBJECTS ELECTRICALLY

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 886 days.

(21) Appl. No.: 13/433,166

(22) Filed: Mar. 28, 2012

(65) Prior Publication Data

US 2012/0192415 A1 Aug. 2, 2012

Related U.S. Application Data

(62) Division of application No. 12/053,570, filed on Mar. 22, 2008, now Pat. No. 8,166,646.

(30) Foreign Application Priority Data

Mar. 28, 2007 (JP) ................. 2007-084477

(51) Int. Cl.
*B41J 2/16* (2006.01)
*H05K 3/36* (2006.01)
(Continued)

(52) U.S. Cl.
CPC ........... *H05K 3/361* (2013.01); *B41J 2/14233* (2013.01); *B41J 2/161* (2013.01); *B41J 2/1623* (2013.01);
(Continued)

(58) Field of Classification Search
CPC ...... H05K 3/0052; H05K 3/107; H05K 3/321; H05K 3/361; H05K 3/363; H05K 3/4069; H05K 2201/09127; H05K 2201/10378; H05K 2201/10674; H05K 2203/013; H05K 1/0272; H05K 3/3405; H05K 3/3415; B41J 2/14233; B41J 2/161; B41J 2/1623; B41J 2/1626; B41J 2/1632; B41J 2/1634; B41J 2/1642; B41J 2/1646; B41J 2002/14491; H01L 2924/00; H01L 2924/0002; Y10T 29/49117; Y10T 29/49124; Y10T 29/49147; Y10T 29/49155; Y10T 29/49165
See application file for complete search history.

(56) References Cited

U.S. PATENT DOCUMENTS 5,949,142 A * 9/1999 Otsuka ................ H01L 2924/00
257/703
6,450,617 B1 * 9/2002 Kitani et al. ........... B41J 2/1623
(Continued)

FOREIGN PATENT DOCUMENTS

EP 1720389 A2 11/2006
EP 1739733 A2 1/2007
(Continued)

OTHER PUBLICATIONS

European Patent Office, European Search Report for European Patent Application No. 08005346.5 (counterpart to co-pending U.S. Appl. No. 12/053,570), dated Feb. 24, 2010.
(Continued)

*Primary Examiner* — A. Dexter Tugbang
(74) *Attorney, Agent, or Firm* — Baker Botts L.L.P.

(57) ABSTRACT

A method for connecting two objects electrically by an electroconductive liquid is described. The method includes providing a substrate having a first surface and a second surface opposite to the first surface. Thereafter, the method includes forming a channel of the liquid on the first surface of the substrate to extend along the first surface of the substrate. Further, the method includes forming a through hole in the substrate. Moreover, the method includes arranging the two objects to interpose the substrate, wherein the two objects overlap with the openings of the through hole. Next, the method further includes filling the liquid to the
(Continued)

through hole via the channel, bringing the liquid in contact with the two objects, and hardening the liquid. Further still, the method further includes wherein a surface of the liquid hole bulges to form a projection which makes contact with one of the two objects.

9 Claims, 16 Drawing Sheets

(51) Int. Cl.
*H05K 3/34* (2006.01)
*B41J 2/14* (2006.01)
*H05K 3/32* (2006.01)
*H05K 1/02* (2006.01)
*H05K 3/00* (2006.01)
*H05K 3/10* (2006.01)
*H05K 3/40* (2006.01)

(52) U.S. Cl.
CPC ............ *B41J 2/1626* (2013.01); *B41J 2/1632* (2013.01); *B41J 2/1634* (2013.01); *B41J 2/1642* (2013.01); *B41J 2/1646* (2013.01); *H05K 3/321* (2013.01); *H05K 3/3405* (2013.01); *H05K 3/3415* (2013.01); *B41J 2002/14491* (2013.01); *H01L 2924/00* (2013.01); *H01L 2924/0002* (2013.01); *H05K 1/0272* (2013.01); *H05K 3/0052* (2013.01); *H05K 3/107* (2013.01); *H05K 3/363* (2013.01); *H05K 3/4069* (2013.01); *H05K 2201/09127* (2013.01); *H05K 2201/10378* (2013.01); *H05K 2201/10674* (2013.01); *H05K 2203/013* (2013.01); *Y10T 29/49117* (2015.01); *Y10T 29/49124* (2015.01); *Y10T 29/49147* (2015.01); *Y10T 29/49155* (2015.01); *Y10T 29/49165* (2015.01)

(56) References Cited

U.S. PATENT DOCUMENTS

| | | |
|---|---|---|
| 2003/0098342 A1 | 5/2003 | Ohashi et al. |
| 2006/0237229 A1 | 10/2006 | Sugahara |
| 2007/0000970 A1 | 1/2007 | Sugahara |
| 2007/0023293 A1 | 2/2007 | Kachi et al. |
| 2007/0063206 A1* | 3/2007 | Maeda ................ B41J 2/14233 |

FOREIGN PATENT DOCUMENTS

| | | |
|---|---|---|
| JP | H11-274671 A | 10/1999 |
| JP | 2001-250842 A | 9/2001 |
| JP | 2004-349618 A | 12/2004 |
| JP | 2004-356255 A | 12/2004 |
| JP | 2006-332615 A | 12/2006 |
| JP | 2007-043119 A | 2/2007 |
| JP | 2007144878 A * | 6/2007 |

OTHER PUBLICATIONS

The State Intellectual Property Office of the People's Republic of China, Notification of First Office Action for Chinese Patent Application No. 200810087290.2 (counterpart to co-pending U.S. Appl. No. 12/053,570), issued Nov. 27, 2009.

European Patent Office, Office Action for European Patent Application No. 08005346.5 (counterpart European patent application), dated Nov. 30, 2012.

European Patent Office; Communication pursuant to Article 94(3) EPC issued for European Patent Application No. 08005346.5 (foreign counterpart of above-captioned patent application), mailed Aug. 26, 2015.

* cited by examiner

METHOD FOR CONNECTING TWO OBJECTS ELECTRICALLY

CROSS REFERENCE TO RELATED APPLICATION

The present application is a divisional application of U.S. patent application Ser. No. 12/053,570, filed Mar. 22, 2008, which issued as U.S. Pat. No. 8,166,646 on May 1, 2012, and which claims the benefit of Japanese Patent Application No. 2007-084477, filed Mar. 28, 2007, the disclosures of which are incorporated herein by reference in their entirety.

BACKGROUND OF THE INVENTION

Field of the Invention

The present invention relates to a method for connecting objects such as wires and circuit elements which are arranged on both surfaces of a substrate.

Description of the Related Art

A substrate which supplies an electric signal etc. to various apparatuses, on which connecting objects (connecting bodies) such as wires and electrodes are arranged on both surfaces thereof, and these connecting objects are electrically connected via through holes formed in the substrate, is available.

As a method of connecting electrically the wires and electrodes which are arranged on both surfaces of a substrate, a method of connecting the electrodes and wires via through holes has been disclosed in FIG. 4 of Japanese Patent Application Laid-open No. 2001-250842. In this method, a substrate, in which through holes and wires are formed, is arranged above a semiconductor chip, on an upper surface of which electrodes are formed, such that the through holes are positioned on the electrodes, and an electroconductive material is filled in the through holes by jetting an electroconductive liquid directly in the through holes from a nozzle of an ink-jet head, and the electrodes and the wires are connected electrically via the through holes.

SUMMARY OF THE INVENTION

In a method of an electrical connection between both surfaces of a substrate described in Japanese Patent Application Laid-open Publication No. 2001-250842, an electroconductive liquid which is jetted from a nozzle of an ink-jet head is jetted onto the substrate so as to land directly in a through hole, and the electroconductive liquid is filled in the through hole. However, in recent years, a degree of integration tends to be high for reasons such as making small a size of the substrate. As a result, a distance (gap) between through holes has become very narrow. In this manner, when the through holes are arranged at a narrow distance (gap), it is extremely difficult to fill the liquid accurately in the through hole by jetting the liquid directly into the through hole from the nozzle, and there is a fear that the liquid might adhere to the substrate without entering into the through hole. In such a case, liquid filled in various holes might get shorted via the liquid adhered to the substrate. Moreover, filling the liquid accurately in the through hole by jetting the liquid directly on to the through hole from a nozzle of a high precision ink-jet head may be taken into consideration. However, such high precision ink-jet head being extremely expensive, the manufacturing cost would increase.

In view of this, an object of the present invention is to provide a method of connecting objects which are arranged on both surfaces of a substrate, by filling easily an electroconductive liquid in through holes even when the through holes are arranged at a narrow distance (gap).

According to a first aspect of the present invention, there is provided a method for connecting two objects electrically by an electroconductive liquid, including:
providing a substrate having a first surface and a second surface which is opposite to the first surface;
forming a liquid-receiving portion, which receives the liquid, on the first surface of the substrate;
forming a channel of the liquid in the substrate which communicates with the liquid-receiving portion;
forming a through hole in the substrate which communicates with the channel and defines openings on the first and second surfaces, respectively;
arranging the two objects to interpose the substrate, at positions at which the two objects overlap with the openings of the through hole, respectively;
making a droplet of the liquid land on the liquid-receiving portion;
filling the liquid landed on the liquid-receiving portion to the through hole via the channel;
bringing the liquid filled in the through hole in contact with the objects arranged to interpose the substrate at positions at which the two objects overlap with the openings of the through hole, respectively; and
hardening the liquid filled in the through hole.

According to the first aspect of the present invention, the liquid-receiving portion is formed on the one surface of the substrate, and the channel communicating with the liquid-receiving portion is formed in the substrate, and further, the hole communicating with the channel is formed in the substrate. Moreover, by making the droplet of the electroconductive liquid land on the liquid-receiving portion, this liquid droplet for example is filled in the through hole via the channel, by a capillary force. At this time, the liquid is filled in the through hole till the electroconductive liquid comes in contact with the two objects (connecting bodies) which are arranged on/above the openings of the hole on both sides of the substrate. Consequently, by hardening the liquid filled in the through hole thereafter, the connecting bodies arranged on/above both surfaces of the substrate are connected electrically via the electroconductive liquid filled in the through hole. According to this method, even when the through holes are arranged at a narrow distance, it is possible to connect electrically the connecting bodies arranged on/above both surfaces of the substrate by filling the electroconductive liquid in the through hole. Moreover, it is advantageous from a point of view of a manufacturing cost.

In the method for connecting two objects electrically according to the present invention, the liquid-receiving section may have a shape of a recess having a size which is capable of accommodating completely a circle having a diameter same as a diameter of the liquid droplet in a plan view; and a width of the channel may be smaller than the diameter of the liquid droplet. In this case, since the liquid-receiving portion has a size which is capable of accommodating completely the circle in which a liquid droplet is projected, it becomes easy to make the liquid droplet land on the liquid-receiving portion. Moreover, only by making the liquid droplet land on the liquid-receiving portion having a wide area, since the liquid flows by an effect of the capillary force for example, in the channel having the width narrower than the diameter of the liquid droplet, and the liquid is filled in the through hole via this channel, the filling of the electroconductive liquid in the through hole is easy.

The method for connecting two objects electrically according to the present invention may further include removing a region of the substrate, which includes the liquid-receiving portion, after filling the liquid in the through hole and bringing the liquid droplet into contact with the objects. Since the liquid-receiving portion and the channel are only for letting the liquid flow to the through hole, when the liquid-receiving portion and the channel become unnecessary after completing the filling, it is possible to remove the liquid-receiving portion and the channel. Accordingly, since it is possible to remove an unnecessary area of the substrate, it becomes possible to reduce a size of the substrate after making the electrical connections.

In the method for connecting two objects electrically according to the present invention, a plurality of individual channels which communicate with the liquid-receiving portion may be formed as the channel upon forming the channel; a plurality of individual through holes which communicate with the individual channels respectively may be formed as the through hole, upon forming the through hole; the liquid landed on the liquid-receiving portion may be filled in the individual through holes via the individual channels respectively from the liquid-receiving portion, upon filling the liquid; and the individual channels may be electrically isolated by removing the area of the substrate which includes the liquid-receiving portion, upon removing the area. In this case, since the plurality of (individual) holes are made to communicate with one liquid-receiving portion via the plurality of (individual) channels, it is possible to fill the liquid in each of the through holes only by making the liquid droplet land on one liquid-receiving portion. Thereafter, when the area of the substrate which includes the liquid-receiving portion is removed, it is possible to separate the channels easily, and to make a state in which the through holes are not connected electrically. In other words, for filling the liquid in the plurality of through holes, it is not necessary to change a position of landing of the liquid droplet, and a filling job becomes easily.

In the method for connecting two objects electrically according to the present invention, a plurality of individual liquid-receiving portions may be formed as the liquid-receiving portion upon forming the liquid-receiving portion; and a plurality of individual channels which communicate with the individual liquid-receiving portions respectively may be formed as the channel upon forming the channel; a plurality of individual through holes which communicate with the individual channels may be formed as the through hole upon forming the through hole; the droplet of the liquid may be made to land on each of the individual liquid-receiving portions upon making the droplet of the liquid land on the liquid-receiving portion; and the liquid landed on each of the individual liquid-receiving portions may be filled in one of the individual through holes via one of the individual channels upon filling the liquid. In this case, since it is possible to fill the liquid in each of the through holes via the channels, by making the liquid land on each of the individual liquid-receiving portions, the filling job becomes easy.

In the method for connecting two objects electrically according to the present invention, a distance between the individual liquid-receiving channels may be greater than a distance between the individual through holes. In this case, even when the distance between the individual through holes is narrow (short) and it is difficult to fill the liquid directly in each through hole, it is possible to fill the liquid in the plurality of individual through holes by making the liquid droplet land on each of the liquid-receiving portions.

In the method for connecting two objects electrically according to the present invention, a wiring which communicates with one of openings of the through hole may be formed as one of the objects, on the first surface of the substrate, at the time of arranging the objects. Accordingly, by filling the liquid in the through hole, it is possible to connect one of the connecting bodies, which is arranged on one surface of the substrate and the wire which is arranged on the other surface of the substrate. Moreover, even when both the connecting bodies are wirings, it is possible to connect the wires by filling the liquid in the through hole.

In the method for connecting two objects electrically according to the present invention, upon forming the through hole in the substrate, a projection which projects inwardly from an inner wall of the through hole may be also formed together with the through hole; and the wiring may be formed such that the wiring covers a surface of the projection upon arranging the objects. In this case, as the liquid is being filled in the through hole, a meniscus of the liquid rises from the opening of the through hole due to a surface tension, and when the liquid is filled further, the meniscus is destroyed at a front end of the projection, and the liquid is spread around the opening of the through hole. At this time, since the wiring is formed on the surface of the projection, the liquid upon the meniscus break at the projection is adhered assuredly to the wiring, and it is possible to connect electrically with the wiring.

In the method for connecting two objects electrically according to the present invention, a liquid repellent property of a surface of the wire may be lower than a liquid repellent property of a surface of the substrate, at an area different from another area at which the wiring is formed. In this case, the liquid which has overflowed from the through hole is susceptible to be adhered to the surface of the wiring, instead of flowing to the surface of the substrate.

In the method for connecting two objects electrically according to the present invention, the channel may be formed inside the substrate. In this case, since the channel is formed at the interior of the substrate when the liquid droplet landed on the liquid-receiving portion flows to the through hole via the channel, the liquid does not overflow outside the substrate from the channel.

In the method for connecting two objects electrically according to the present invention, the channel may be a groove formed on the first surfaces of the substrate. In this case, since the channel is a groove formed on the surface on which the liquid-receiving portion is formed, it is possible to form the channel easily.

In the method for connecting two objects electrically according to the present invention, a liquid repellent property of the first surface of the substrate may be higher than a liquid repellent property of an inner surface of the liquid-receiving portion and a liquid repellent property of the groove. In this case, when the liquid flows from the liquid-receiving portion to the through hole via the groove, the liquid hardly overflows from the liquid-receiving portion and the groove.

The method of connecting electrically according to the present invention, may further include forming a liquid repellent film having a liquid repellent property higher than the liquid repellent property of the inner surface of the liquid-receiving portion and the liquid repellent property of the groove, on the first surface of the substrate, before forming the channel. In this case, it is possible to prevent assuredly the liquid from overflowing from the liquid-receiving portion and the groove.

In the method for connecting two objects electrically according to the present invention, the channel may be formed on the first surface of the substrate; and a liquid repellent property of the channel and a liquid repellent property of the liquid-receiving portion may be lower than a liquid repellent property of an area on the first surface of the substrate, the area being different from another area at which the liquid-receiving portion and the channel are formed. In this case, the liquid droplet landed on the liquid-receiving portion, without flowing to the area having the high liquid repellent property, goes on wetting and spreading on the channel having the low liquid repellent property.

The method of connecting electrically according to the present invention may further include forming, on the first surface of the substrate, a liquid repellent film having a liquid repellent property higher than a liquid repellent property of an area at which the channel and the liquid-receiving portion are to be formed before forming the channel and the liquid-receiving portion; and upon forming the channel and the liquid-receiving portion, the channel and the liquid-receiving portion may be formed by partially removing the liquid repellent film. For example, after the liquid repellent film is formed by coating the surface of the substrate by a fluorine film, by removing the coating on the area which is to be the liquid-receiving portion and the channel, it is possible to form easily the liquid-receiving portion and the channel having the liquid repellent property inferior to the liquid repellent property of the area on which the liquid repellent film is formed. The liquid repellent film may also be removed by irradiating a laser. In this case, a surface of the area from which the liquid repellent film is removed becomes rough, and a liquid repellent property of a surface of this area is declined. Consequently, it is possible to form easily the area having the low liquid repellent property.

In the method for connecting two objects electrically according to the present invention, one of the two objects may be arranged to be away from the substrate upon arranging the two objects. In this case, when the liquid is being filled in the through hole, since the meniscus of the liquid rises from the opening of the through hole due to the surface tension thereof, it is possible to bring the liquid in contact with the objects (connecting body) by using the rising of the meniscus. Since it is possible to arrange the connecting body to be away from the surface of the substrate, a degree of freedom of arrangement of the connecting bodies becomes high.

According to the present invention, even when the through holes are formed at a narrow distance of arrangement, it is possible to fill the electroconductive material easily in the through holes, and to connect electrically the connecting bodies which are arranged on both surfaces of the substrate. Moreover, it is advantageous from the point of view of the manufacturing cost.

BRIEF DESCRIPTION OF THE DRAWINGS

FIG. 6A to FIG. 6F are diagrams showing a process of connecting electrically an electroconductive pattern and an individual electrode of an embodiment in which
FIG. 6A shows a channel forming step,
FIG. 6B shows a through hole forming step,
FIG. 6C shows an arranging step,
FIG. 6D shows a liquid filling step,
FIG. 6E shows a hardening (curing) step,
and FIG. 6F shows a removing step;

FIG. 7A is a plan view of a substrate and FIG. 7B is a cross-sectional view taken along a line VIIB-VIIB in FIG. 7A;

FIG. 8A is a plan view of the substrate and FIG. 8B is a cross-sectional view taken along a line VIIIB-VIIIB in FIG. 8A;

FIG. 9A is a plan view of the substrate and FIG. 9B is a cross-sectional view taken along a line IXB-IXB in FIG. 9A;

FIG. 10A is a plan view of the substrate and FIG. 10B is a cross-sectional view taken along a line XB-XB in FIG. 10A;

FIG. 11A is a plan view of the substrate and FIG. 11B is a cross-sectional view taken along a line XIB-XIB in FIG. 11A;

FIG. 12A is a plan view of the substrate, and FIG. 12B is a cross-sectional view taken along a line XIIB-XIIB in FIG. 12A;

FIG. 13A is a plan view of the substrate, and FIG. 13B is a cross-sectional view taken along a line XIIIB-XIIIB in FIG. 13A;

FIG. 14A is a plan view of the substrate, and FIG. 14B is a cross-sectional view taken along a line XIVB-XIVB in FIG. 14A;

FIG. 15A is a plan view of the substrate, and FIG. 15B is a cross-sectional view taken along a line XVB-XVB in FIG. 15A.; FIG. 16A is a plan view of the substrate, and FIG. 16B is a cross-sectional view taken along a line XVB-XVB in FIG. 16A.

DETAILED DESCRIPTION OF THE PREFERRED EMBODIMENTS

An embodiment of the present invention will be described below. This embodiment is an example in which the present invention is applied to a piezoelectric actuator of an ink-jet printer which records a desired image and characters by jetting the ink on to a recording paper, the piezoelectric actuator applying a jetting pressure to an ink.

Figure 1:
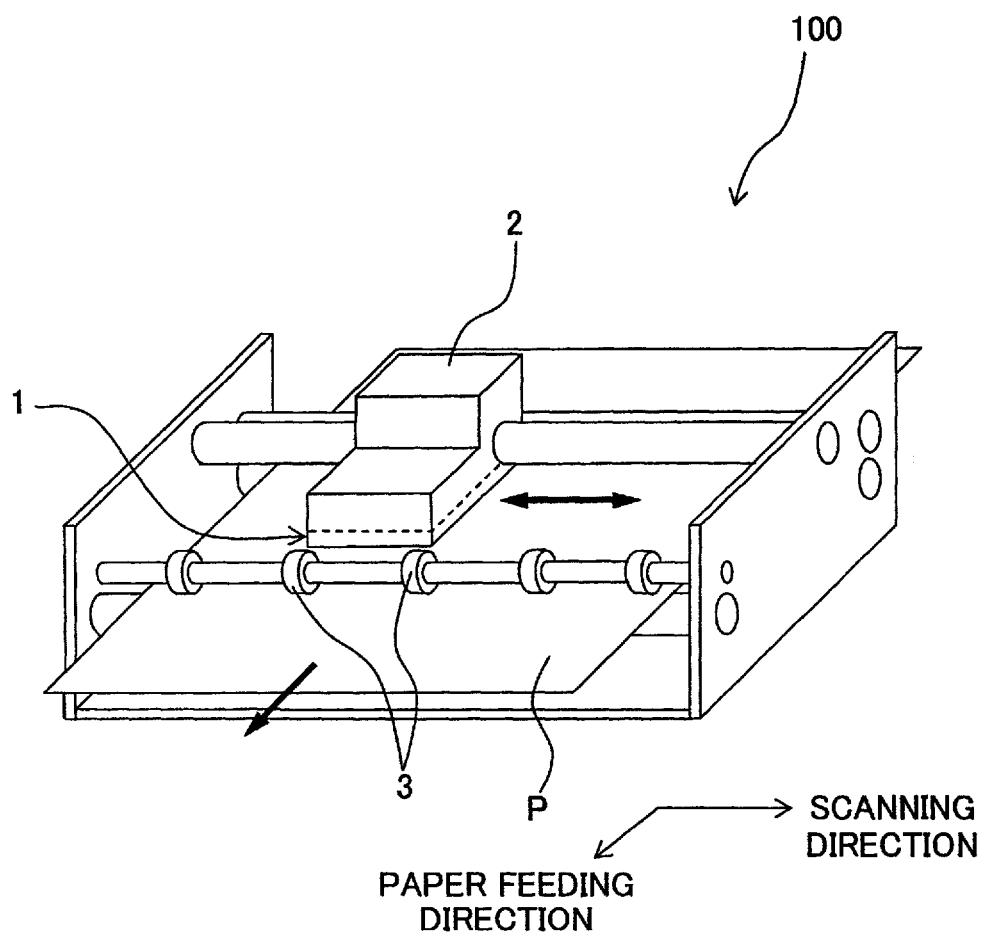
FIG. 1 is a schematic structural view of an ink-jet printer.

Firstly, the ink-jet printer will be described. As shown in FIG. 1, an ink-jet printer 100 includes a carriage 2 which is movable in a left and right direction in FIG. 1, an ink-jet head 1 of a serial type which is provided in the carriage 2 and which jets the ink onto a recording paper P, and transporting rollers 3 which transport the recording paper P in a frontward direction in FIG. 1. The ink-jet head 1 moves in the left and right direction (scanning direction) integrally with the carriage 2, and jets the ink onto the recording paper P from nozzles 20 (refer to FIG. 2) to record desired characters and image, the nozzles being arranged in a lower surface of the ink-jet head 1. Moreover, the recording paper P with an image recorded thereon is discharged frontward (paper feeding direction) by the transporting rollers 3.

Next, the ink-jet head 1 will be described below. As shown in FIGS. 2 to 5, the ink-jet head 1 includes a channel unit 4, a piezoelectric actuator 5, and a Flexible Printed Circuit (FPC) 40.

Figure 5:
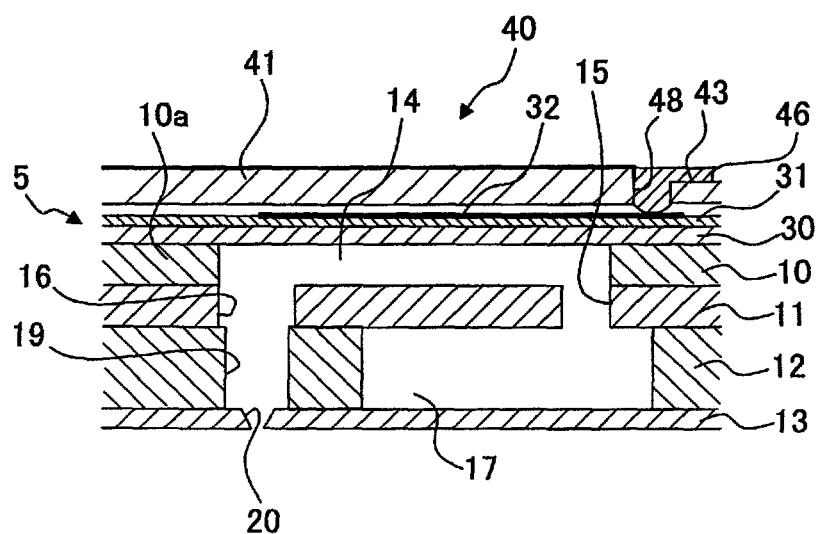
FIG. 5 is a cross-sectional view taken along a line IV-IV in FIG. 4.

Firstly, the channel unit 4 will be described below. As shown in FIG. 5, the channel unit 4 includes a cavity plate 10, a base plate 11, a manifold plate 12, and a nozzle plate 13 which are joined in stacked layers in this order from an upper layer.

As shown in FIGS. 2 to 5, a plurality of pressure chambers 14 arranged along a plane are formed as holes formed through the cavity plate 10 which is at a topmost position (uppermost layer) in the four plates 10 to 13. An upper side and a lower side of the pressure chambers 14 is covered by the base plate 11 and a vibration plate 30 which will be described later. Moreover, the pressure chambers 14 are arranged in two rows and in each of the rows, a plurality of pressure chambers 14 are aligned in a paper feeding direction (vertical direction in FIG. 2). Furthermore, each of the pressure chambers 14 has a substantially elliptical shape in a plan view which is elongated in the scanning direction (left and right direction).

Figure 4:
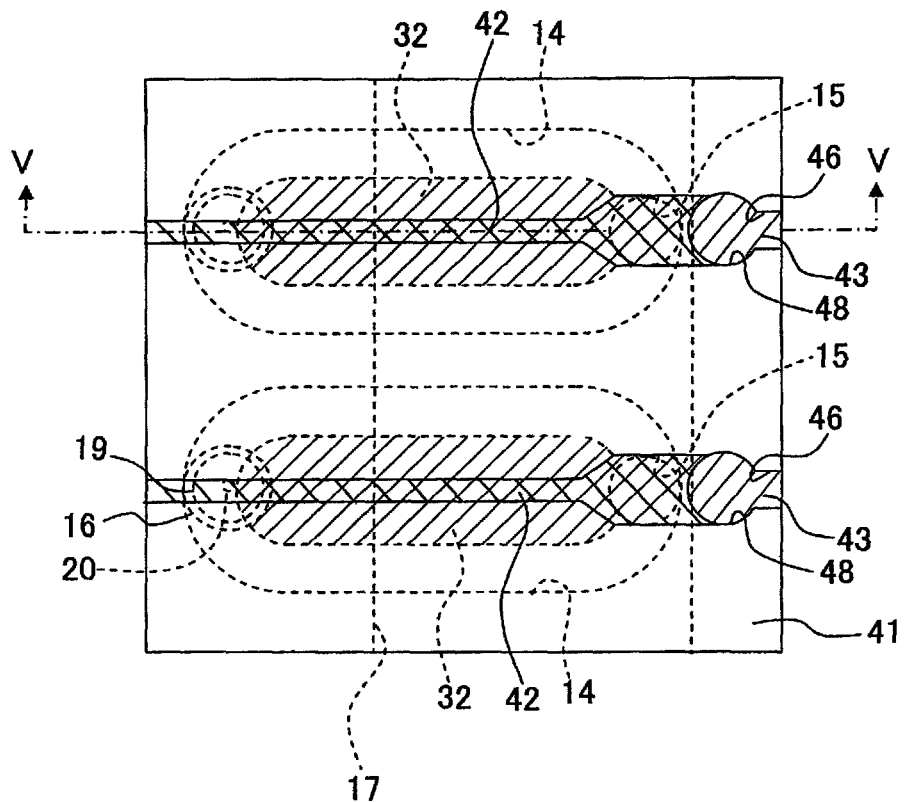
FIG. 4 is a partially enlarged view of FIG. 3.

As shown in FIGS. 4 and 5, communicating holes 15 and 16 are formed in the base plate 11, at positions overlapping with both end portions of the pressure chamber 14 in a plan view. Moreover, two manifolds 17 extended in the paper feeding direction are formed in the manifold plate 12, such that the manifolds 17 overlap with a portion toward the communicating hole 15 of the pressure chambers 14 arranged in two rows. These two manifolds 17 communicate with an ink supply port 18 formed in the vibration plate 30 (refer to FIG. 2) which will be described later, and the ink is supplied to the manifolds 17 from an ink tank which is not shown in the diagram, via the ink supply port 18. Furthermore, a plurality of communicating holes 19 which communicate with the communicating holes 16 are formed in the manifold plate 12 at positions overlapping with an end portion of the pressure chambers 14, the end portion being opposite to the manifolds 17 in a plan view.

Figure 2:
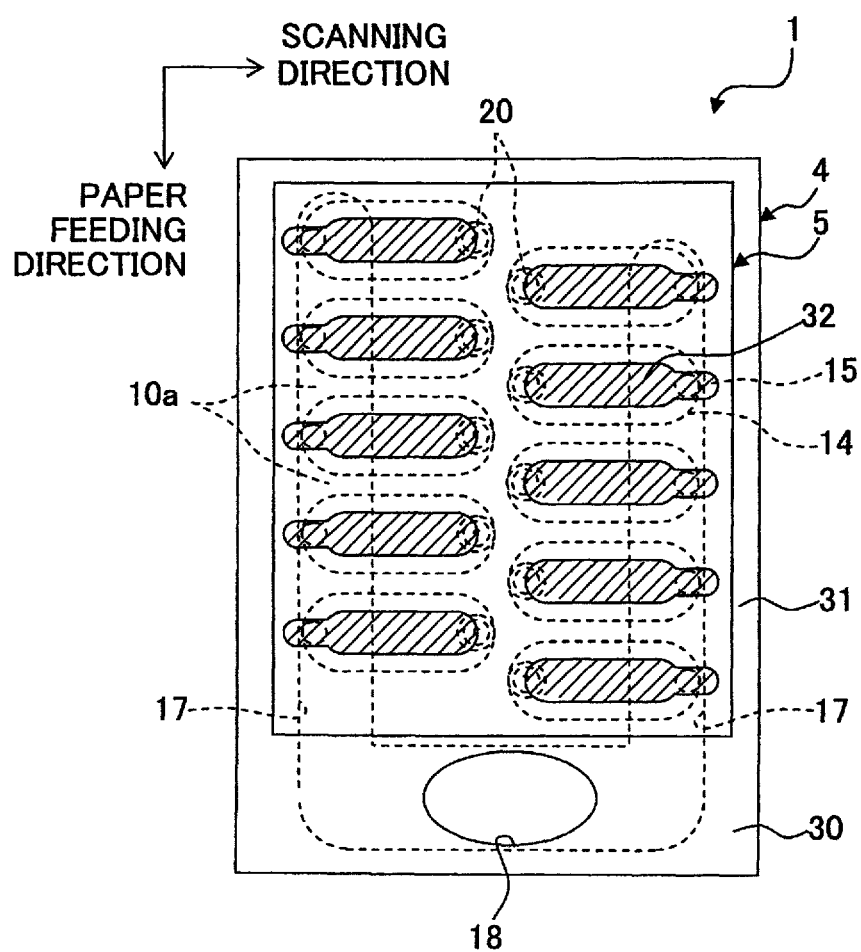
FIG. 2 is a plan view of an ink-jet head excluding an FPC.

A plurality of nozzles 20 is formed in the nozzle plate 13 at positions overlapping with the communicating holes 19 in a plan view. As shown in FIG. 2, the nozzles 20 are arranged in two nozzle rows. In each of the nozzle rows, nozzles 20 are aligned in the paper feeding direction so as to overlap with the end portion of the pressure chambers 14 arranged in two rows along the paper feeding direction, the end portion being opposite to the manifolds 17.

As shown in FIG. 5, the manifold 17 communicates with the pressure chamber 14 via the communicating hole 15, and further, the pressure chambers 14 communicate with the nozzles 20 via the communicating holes 16 and 19, respectively.

Next, the piezoelectric actuator 5 will be described below. As shown in FIGS. 2 to 5, the piezoelectric actuator 5 includes the vibration plate 30 which is arranged on an upper surface of the cavity plate 10 having the pressure chambers 14, a piezoelectric layer 31 which is formed, on an upper surface of the vibration plate 30, to be spread continuously over the pressure chambers 14, and a plurality of individual electrodes 32 arranged on an upper surface of the piezoelectric layer 31.

The vibration plate 30 is a metallic plate having a substantially rectangular shape in a plan view. The vibration plate 30 is joined to the upper surface of the cavity plate 10 at a portion surrounding the pressure chambers 14, in a state in which the vibration plate 30 covers the pressure chambers 14. Moreover, the piezoelectric layer 31 is arranged between the individual electrodes 32 and the upper surface of the vibration plate 30 which is electroconductive, and the upper surface of the vibration plate 30 also serves as a common electrode which generates an electric field in a thickness direction of the piezoelectric layer 31.

The piezoelectric layer 31 is formed on the upper surface of the vibration plate 30 in a plan view. The piezoelectric layer 31 is made of a piezoelectric material, which is composed mainly of lead zirconate titanate (PZT) which is a solid solution of lead titanate and lead zirconate, and which is a ferroelectric substance. This piezoelectric layer 31 is formed continuously to cover the pressure chambers 14.

The individual electrodes 32 having a substantially elliptical shape slightly smaller than the pressure chambers 14 are formed on the upper surface of the piezoelectric layer 31, corresponding to the pressure chambers 14 respectively. These individual electrodes 32 are formed in an area facing the corresponding pressure chambers 14, at a central portion away from a periphery of the pressure chambers 14. The individual electrodes 32 are formed of an electroconductive material such as gold, silver, palladium, platinum, or titanium. Further, the individual electrodes 32 are arranged in two rows, and one of end portions near the communicating hole 15 (left or right end portions) of the individual electrodes 32 are extended to an outer area of the piezoelectric layer crossing over the periphery of the pressure chamber 14, the outer area overlapping with an outer side of the pressure chamber 14.

Figure 3:
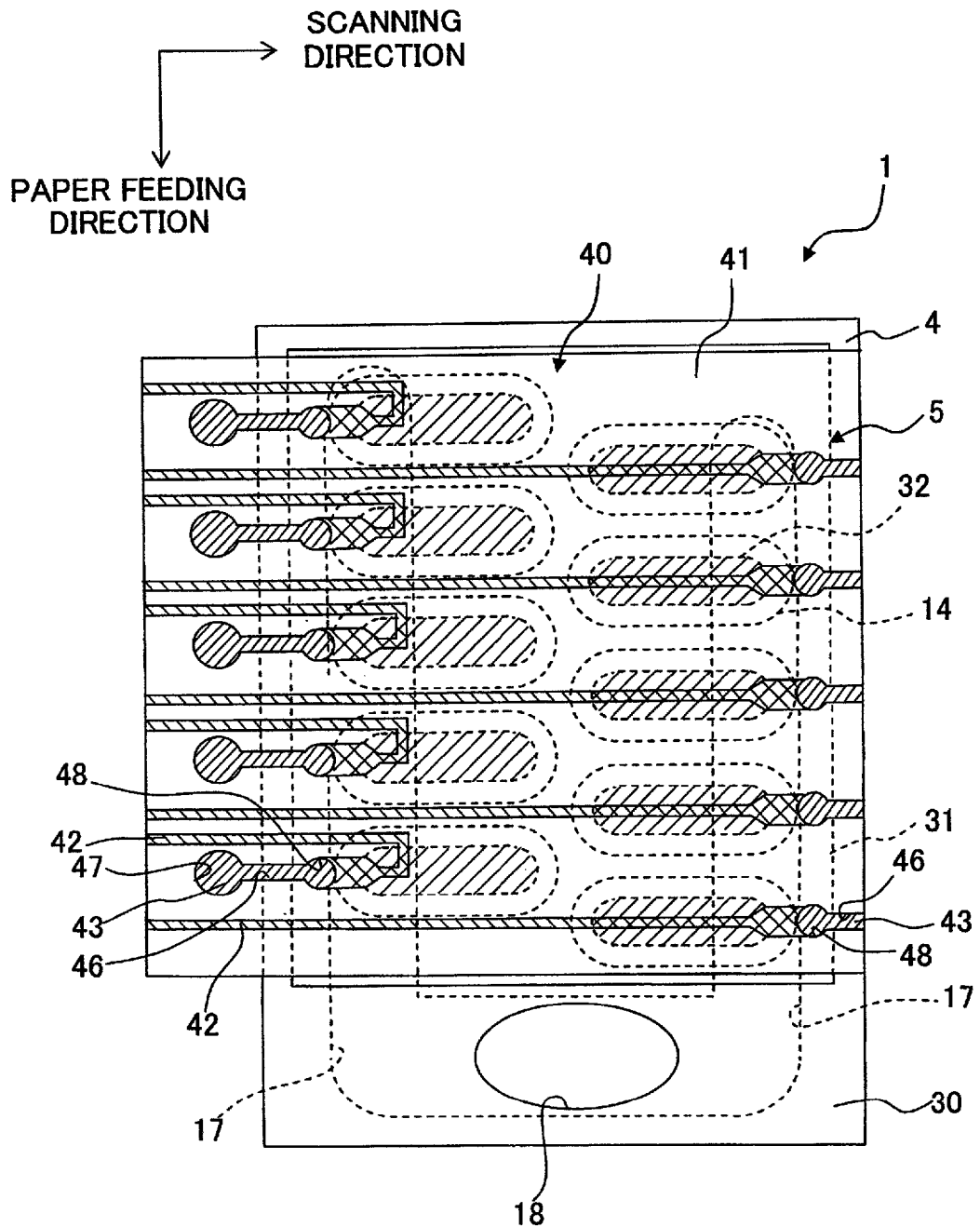
FIG. 3 is a plan view of the ink-jet head.

Next, the FPC 40 which transmits the drive voltage supplied from a driver IC (not shown) to the individual electrodes 32 will be described below. As shown in FIGS. 3 to 5, the FPC 40 has a substrate 41 which is arranged on an upper surface of the piezoelectric actuator 5. The substrate 4 is made of a synthetic resin material such as a polyimide resin.

A plurality of wires 42 is formed on an upper surface of the substrate 41. Moreover, a plurality of recesses 47 ((individual) liquid-receiving portions) and a plurality of grooves ((individual) channels) 46 in which an electroconductive material 43 is filled are formed on the upper surface of the substrate 41. Furthermore, a plurality of through holes (individual through holes) 48 which make communicate the upper surface and a lower surface of the substrate 41, is formed in the substrate 41, and the electroconductive material 43 is filled in these through holes 48. As shown in FIG. 5, the electroconductive material 43 which is exposed from a lower side of the through hole 48 (lower surface of the substrate 41) is bulged downward in a form of a projection, and is connected to the individual electrode 32 by making a contact with the individual electrode 32.

One end of each of the wires 42 is connected to a part of a periphery of the respective through hole 48, and is connected electrically by making a contact with the electroconductive material 43 filled in the through hole 48. The other end of each of the wires 42 is connected electrically by making a contact with a terminal of the drive IC which is not shown in the diagram. Accordingly, a predetermined drive voltage is applied to the individual electrodes 32 from the terminals of the driver IC via the wires 42 and the electroconductive material 43, at the time of driving the piezoelectric actuator 5. When the predetermined drive voltage is applied to the individual electrode 32, droplets of ink are jetted from the nozzle 20 corresponding to this individual electrode 32.

Next, in the ink-jet head 1 described above, a method for connecting electrically the wires 42 formed on an upper surface of the FPC 40 and the individual electrodes 32 of the piezoelectric actuator 5 arranged on a lower surface side of the FPC 40, will be described below with reference to FIGS. 6A to 8B.

Figure 6A:
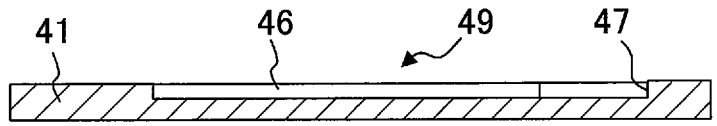
Figure 7A:
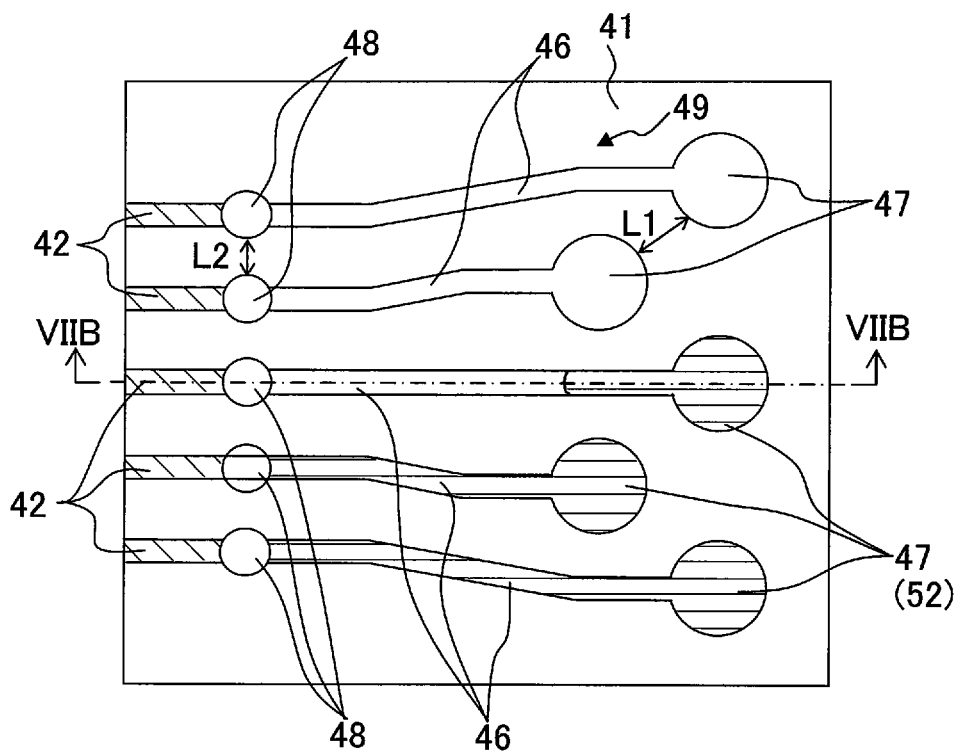
FIGS. 7A and 7B are schematic diagrams of the channel forming step, the through hole forming step, the arranging step, and the liquid filling step, where.

Firstly, as shown in FIG. 6A, the substrate 41 made of a flexible synthetic resin material such as a polyimide resin, an aramid resin, a phenolic resin, and a liquid crystal polymer is provided. A filled channel (filling channel) 49 having the recesses 47, and the grooves 46 communicating with the recesses 47 respectively are formed on the upper surface (first surface) of the substrate 41 (filling channel forming step). As shown in FIG. 7A, the recesses 47 have a circular shape in a plan view, and are arranged in a staggered (zigzag) form along a vertical direction in FIG. 7A. One end of the grooves 46 communicates with the recess 47, and the groove 46 is extended in a left and right direction in FIG. 7A. Moreover, a cross-section of the groove 46 has a substantially rectangular shape.

Here, the recess 47 is formed such that a diameter of the recess 47 is larger than a width of the groove 46. The recesses 47 and the grooves 46 are formed by a laser machining in which a laser such as an excimer laser, a YAG laser, or a femto second laser is used. At this time, a liquid repellent property of an inner surface of the groove 46 and the recess 47 is inferior to a liquid repellent property of the upper surface of the substrate 41. Since a surface irradiated by the laser become a rough surface, a liquid repellent property of a surface which defines the recesses 47 and the grooves 46 becomes inferior. In this manner, the laser machining is preferable for realizing easily the inner surface of the recess 47 and the groove 46 having the liquid repellent property inferior to the liquid repellent property of the upper surface of the substrate 41.

Figure 6B:

Next, as shown in FIG. 6B, the through hole 48 cut through the upper surface and the lower surface of the substrate 41 is formed at one end of the groove 46, where the recess 47 is not formed (through hole forming step). In other words, the recess 47 and the through hole 48 communicate via the groove 46. The through hole 48 is formed by laser machining in which a laser such as the excimer laser, the YAG laser, or the femto second laser is used. At this time, as shown in FIG. 7, a distance L1 between the recesses 47 is made to be longer than a distance L2 between the through holes 48.

Figure 6C:
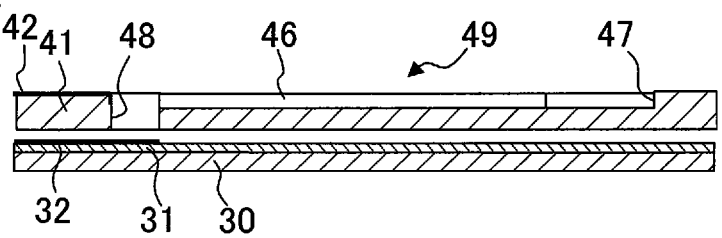

Next, as shown in FIG. 6C, the wire 42 is formed on the upper surface of the substrate 41 by a method such as a screen printing, a vapor deposition method, and a sputtering method, such that one end thereof is connected to a part of a periphery of the through hole 48. A liquid repellent property of a surface of the wire 42 is inferior to the liquid repellent property of the surface of the substrate 41. The other end of the wire 42 is connected to the terminal of the driver IC (not shown). Moreover, the substrate 41 is arranged above the upper surface of the individual electrode 32 which is arranged on the piezoelectric actuator 5, such that an opening of the through hole 48 is positioned at a predetermined distance (arranging step). Accordingly, the individual electrode 32 and the wire 42, which are connecting bodies, are arranged on/above both surfaces (respective surfaces) of the substrate 41, respectively. The connecting bodies such as the individual electrode 32 and wire 42 may be arranged so as to partially overlap with the openings of the through hole 48.

Figure 6D:
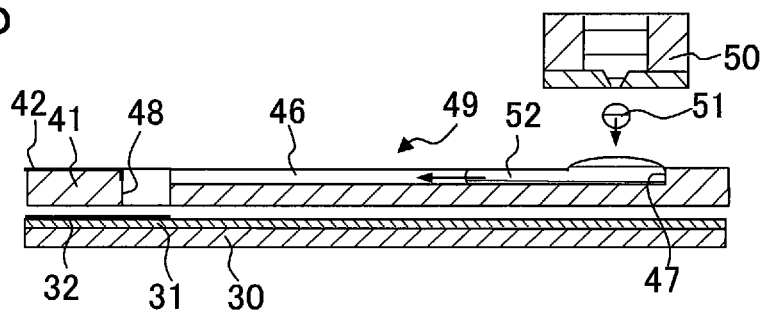

Next, as shown in FIG. 6D, an electroconductive liquid droplet 51 is jetted, by a liquid-droplet jetting apparatus 50 such as an ink-jet head and a micro dispenser, to land on the recess 47 communicating with each groove 46, and an electroconductive liquid 52 is filled into the through hole 48 via the groove 46. It is possible to use various liquids as the electroconductive liquid 52. An example of a case in which a nano electroconductive particle ink in which metallic nano particles (of about 7 nm diameter for example) of a metal such as silver and gold exist in independently dispersed state without being coagulated (agglutinated) in a solvent, is discussed below.

Figure 7B:
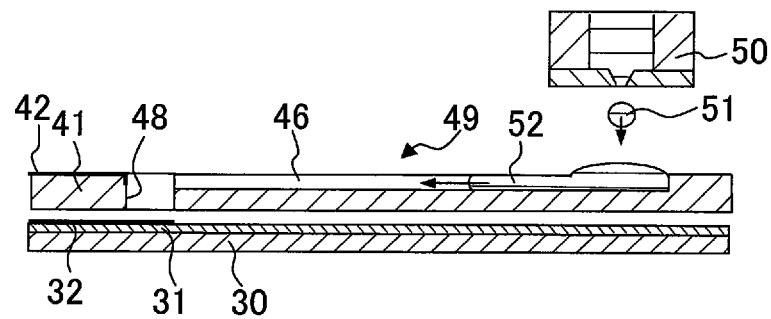

As shown in FIGS. 6D, 7A and 7B, when the liquid droplet 51 lands on the recess 47, since the width of the groove 46 is sufficiently narrow, the liquid 52 is sucked into the groove 46 due to an effect of a capillary force. Since the inner surface of the groove 46 is susceptible to wetting (wetting angle is smaller than 90 degree), the liquid 52 goes on spreading and wetting along the groove 46 (capillary phenomenon). Due to the capillary phenomenon, the liquid 52 which is flowed into the groove 46 flows up to the through hole 48. At this time, the liquid 52 is completely filled in the through hole 48, and makes a contact with the wire 42, and then by further filling the liquid 52, the surface of the liquid 52 at a lower end opening of the through hole 48 is bulged to form a projection because of the surface tension, and a portion which is projected makes a contact with the individual electrode 32 (liquid filling step).

Here, as it has been described above, since the liquid repellent property of the upper surface of the substrate 41 is superior to the liquid repellent property of the inner surface of the groove 46 and the recess 47, the liquid 52 flowing from the recess 47 to the groove 46 hardly overflows to the upper surface of the substrate 41.

As shown in FIGS. 7A and 7B, it is preferable to form the groove 46 and the recess 47 at the channel forming step described above, such that the diameter of the recess 47 (70 µm for example) is larger than a diameter of the liquid droplet 51 (40 µm for example) during flight before landing, and further, the width of the groove 46 (20 µm for example) is smaller than the diameter of the liquid droplet 51. In this case, since the recess 47 has a size which is capable of including (accommodating) completely a circle projected by the liquid droplet 51, it becomes easy to make the liquid droplet 51 land on the recess 47. Moreover, only by making the liquid droplet 51 land in the recess 47 having a wide area, the liquid 52 flows to the groove 46 having the width narrower than the diameter of the liquid droplet 51 due to the effect of the capillary force, and the liquid is filled in the through hole 48 via this groove 46. Therefore, the filling of the liquid 52 in the through hole 48 is easy.

Moreover, when the distance between the recesses 47 is narrow, it might be difficult to fill the liquid 52 by directly jetting into the through hole 48. Even in such a case, in the present invention, since the distance between the recesses 47 communicating with the through holes 48 is longer than the distance between the through holes 48, it is possible to fill the liquid 52 in the through holes 48 by making a liquid droplet land on each of the recesses 47.

Furthermore, since the liquid repellent property of the surface of the wire 42 is lower than that of the surface of the substrate 41, the liquid 52 overflowed from the through hole 48 is not flowed to the surface of the substrate 41, and is easily adhered to the surface of the wire 42 having the liquid repellent property lower (wetting angle smaller) than the liquid repellent property of the surface of the substrate 41.

Figure 6E:
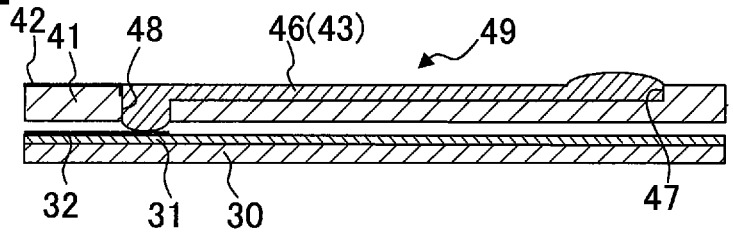

Next, as shown in FIG. 6E, the substrate 41 is heated to a predetermined temperature (for example, about 200° C. when the substrate 41 is made of a polyimide resin) which is not higher than an upper temperature limit of the substrate 41, and the liquid 52 filled in the grooves 46, the recesses 47, and the through holes 48 is hardened (cured) by baking (hardening step, curing step). In other words, the liquid 52 becomes the electroconductive material 43 upon hardening. Since the individual electrode 32 and the wire 42 arranged on two surfaces of the substrate 41 make contact with this electroconductive material 43, the individual electrode 32 and the wire 42 are connected electrically via the electroconductive material 43.

Figure 6F:
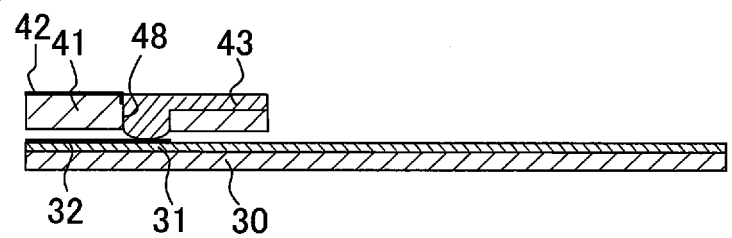
Figure 8A:
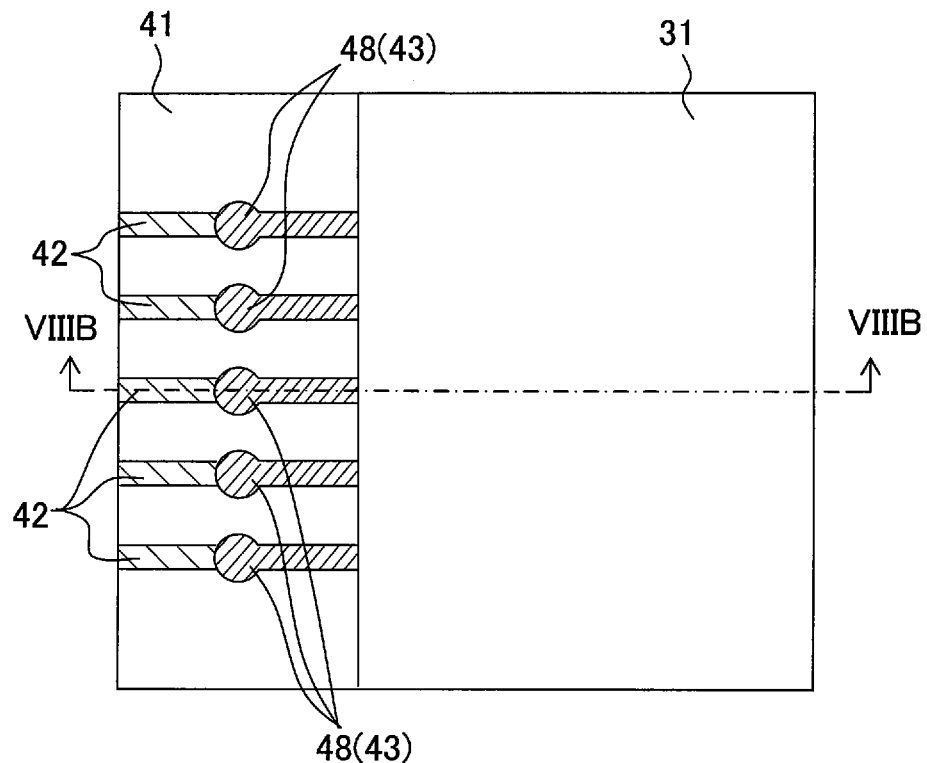
FIG. 8A and FIG. 8B are schematic diagrams of the removing step, where.
Figure 8B:
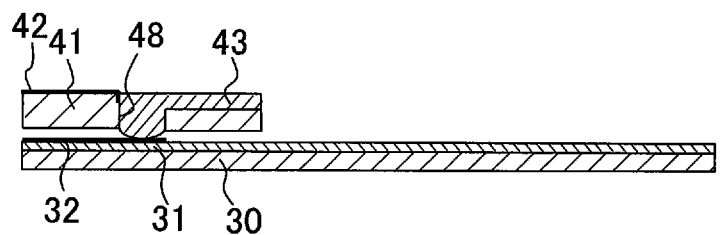

Further, as shown in FIGS. 6F, 8A and 8B, the recess 47 and the groove 46 of the substrate 41 are removed by cutting by a dicer etc., in an area near the through hole 48 (removing step). Accordingly, when the recess 47 and the groove 46 are not removed, dust may be adhered between the recesses 47 and the grooves 46, and it may cause a short-circuit. Therefore it is possible to prevent from getting shorted (short-circuit) by removing the recess 47 and the groove 46 of the substrate 41.

In the above discussion, an ink having nano electroconductive particles is exemplified as the electroconductive liquid 52. However, it is also possible to use other electroconductive liquids such as a fused (melted) solder. For example, in a case of using the solder, at the liquid filling step (FIG. 6D), the solder is filled in the groove 46, the recess 47, and the through hole 48 with the substrate 41 heated to a temperature of a fusing (melting) point or more of the solder (100° C. to 180° C. for example). Then, at the hardening step (FIG. 6E), it is possible to harden the solder filled in the groove 46, the recess 47, and the through hole 48 by lowering the temperature of the substrate 41 to a temperature lower than the melting point of the solder.

Moreover, in the above example, the removing step (FIG. 6F), in which the recess 47 and the groove 46 of the substrate are removed by cutting by a dicer up to an area near the through hole 48, is carried out after the hardening step (FIG. 6E). However, it is also possible to carry out the removing step before the hardening step, in other words, it is possible to carry out the removing step immediately after the liquid filling step (FIG. 6D). It is possible to use this in a case in which the liquid 52 does not flow from a cutting location due to a reason such as a high viscosity of the liquid 52 filled in the through hole 48. In other words, even in a state before hardening the liquid 52, when it is possible to maintain the state of the liquid 52 filled in the through hole 48 having made a contact with the wire 42 and the individual electrode 32, the removing step may be carried out before the hardening step.

According to a method for making an electrical connection between the wire formed on the FPC 40 and the individual electrode 32 arranged in the piezoelectric actuator 5 (a method of connecting electrically (method for making electrical connections between both surfaces of substrate), as described above, the following effect is achieved. The recess 47, and the groove 46 which communicates with the recess 47, are formed on one surface of the FPC 40, and further, the through hole 48 which communicates with the groove 46 is formed in the FPC 40. When the liquid droplet 51 lands on the recess 47, this liquid droplet 51 advances via the groove 46 by the capillary force and reaches the through hole 48 to fill the through hole 48. Furthermore, the liquid 52 is filled in the through hole 48 till the electroconductive liquid 52 makes a contact with each of the wire 42 and the individual electrode 32, the wire 42 being connected to a part of the surrounding portion of the through hole 48 on the upper surface (first surface) of the FPC 40, and the individual electrode 32 being arranged near an opening of the through hole 48 on the lower surface (second surface) of the FPC 40. Hereafter, when the liquid 52 in the through hole 48 is hardened, the wire 42 and the individual electrode 32 on both surfaces of the FPC 40 are connected electrically via the electroconductive liquid 43 filled in the through hole 48. According to this method, even in a case in which the through holes 48 are formed at a narrow distance, it is possible to fill the electroconductive material 43 in the through holes 48, and to connect electrically the wire 42 and terminals of the driver IC arranged on both surfaces of a substrate such as the FPC 40. Moreover, this is advantageous from a point of view of a manufacturing cost.

Next, modified embodiments in which various modifications are made in the embodiment will be described below. However, same reference numerals are used for components having a structure similar to the components in the embodiment, and the description of such components is omitted.

First Modified Embodiment

In the embodiment described above, the recess 47 and the groove 46 of the substrate 41 has been removed by cutting by a dicer etc., up to the area surrounding the through hole 48. However, in a case of using this recess 47 and the groove 46 as terminals and wires, the removing step may not be carried out. In other words, the recess 47 and the groove 46 may not be removed.

Second Modified Embodiment

Figure 9A:
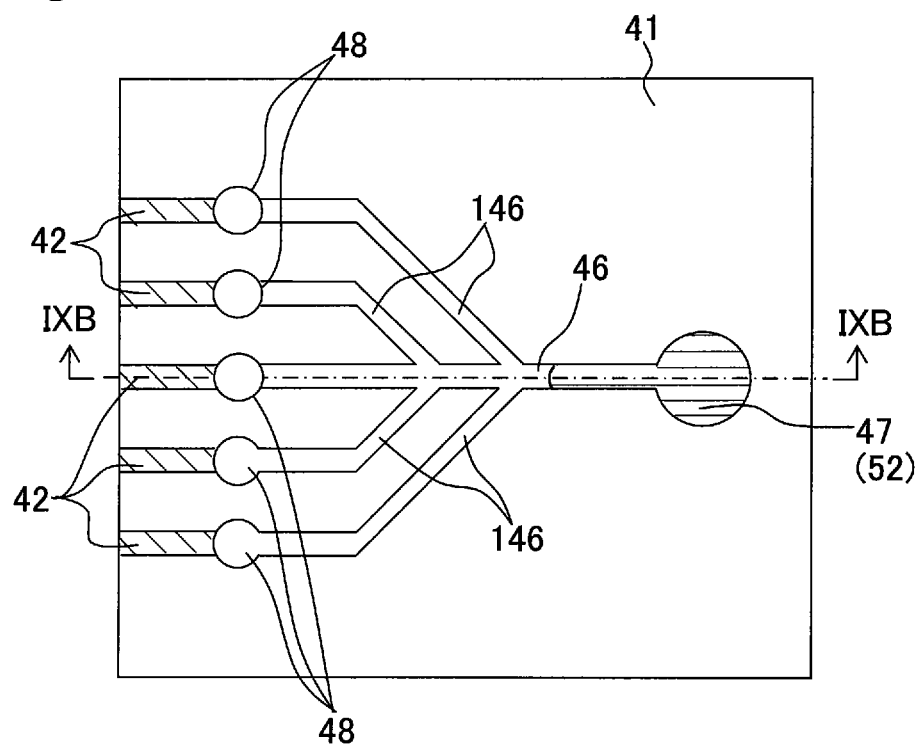
FIG. 9A and FIG. 9B are schematic diagrams corresponding to FIG. 7, of a second modified embodiment, where.
Figure 9B:
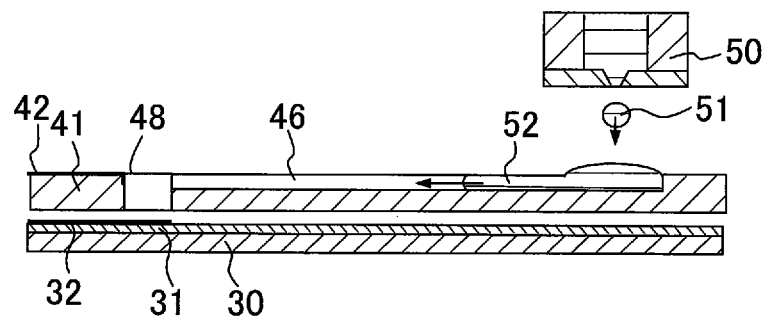

In the embodiment described above, the plurality of grooves 46 has been formed in the substrate 41, and a recess 47 has been formed at one end of each groove 46. However, the number and an arrangement of the grooves 46 and the recesses 47 may be arbitrary. For example, as shown in FIG. 9, one recess 47, one groove 46, a plurality of branched grooves 146, and a plurality of through holes 48 are formed in the substrate 41. One end of the groove 46 communicates with the recess 47, and the other end of the groove 46 communicates with one through hole 48. Moreover, one end of the branched grooves 146 communicates with a middle portion of the groove 46 in a longitudinal direction, and the other end of these branched grooves 146 communicates with the respective through hole 48. Accordingly, when the liquid droplet 51 jetted from the liquid-droplet jetting apparatus 50 lands on the recess 47, the liquid 52 is sucked into the groove 46 by the effect of the capillary force. Moreover, the liquid 52 which flows through the groove 46 is further sucked into the branched groove 146 due to the capillary force. In this manner, the liquid 52 flowing through the groove 46 and the branched groove 146 is filled in each through hole 48. Furthermore, the liquid 52 filled in the through hole 48 makes a contact with the wire 42 which is formed on the upper surface of the substrate 41 and the individual electrode 32 which is arranged on the lower surface of the substrate 41. Thereafter, the liquid 52 is hardened during the hardening step. Further, during the removing step, the recess 47, the groove 46, and the branched grooves 146 of the substrate 41 are removed by cutting up to an area near the through hole 48 (to an extent that the groove 46 and the branched grooves 146 do not communicate). Accordingly, it is possible to separate (divide) electrically the liquid 52 in the through holes 48 which had been electrically connected because of the electrical connection among the recess 47, the groove 46, the branched grooves 146, and the through hole 48.

In case the recess 47, the groove 46, and the branched grooves 146 are removed during the removing step, it is possible to fill the liquid 52 in the plurality of through holes 48 by making the plurality of through holes 48 communicate with one recess 47 via the groove 46 and the branched groove 146, and by making land the liquid droplet 51 on one recess 47. Moreover, the recess 47, the groove 46, and the branched groove 146 are removed up to the area near the through hole 48 (to an extent that the groove 46 and the branched groove 146 do not communicate) to divide the groove 46 and the branched groove 146, and the liquid 52 in the through holes 48 are disconnected electrically. Since it is not necessary to change a position of landing of the liquid droplet 51 for filling the liquid 52 in each through hole 48, a filling job becomes easy.

Third Modified Embodiment

Figure 10A:
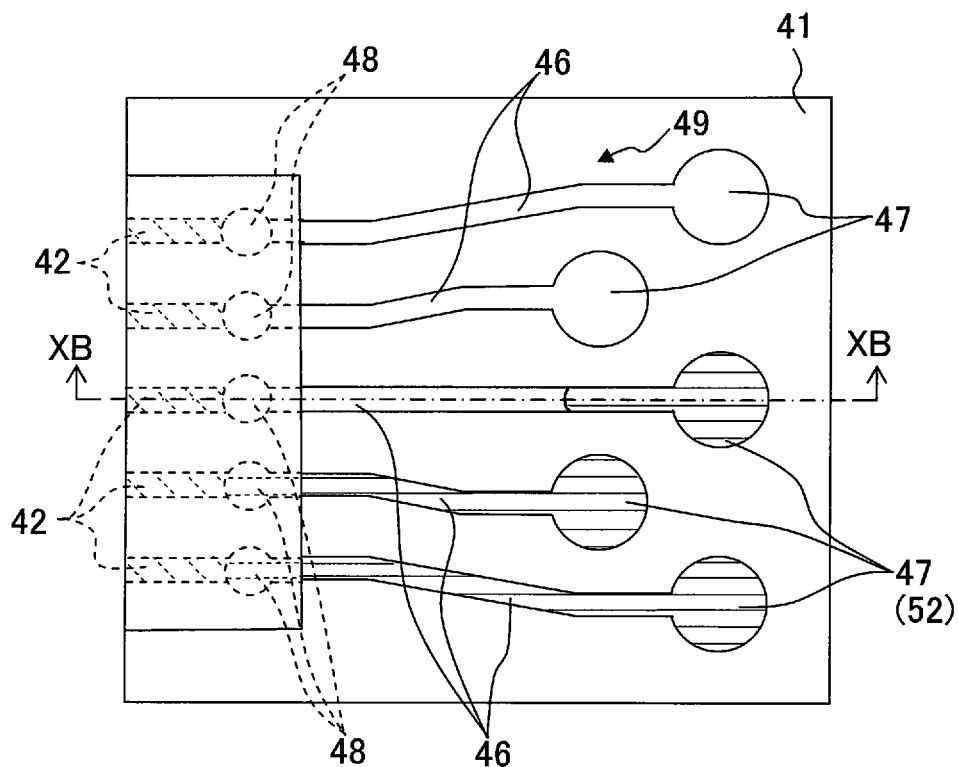
FIG. 10A and FIG. 10B are schematic diagrams corresponding to FIG. 7, of a third modified embodiment, where.
Figure 10B:
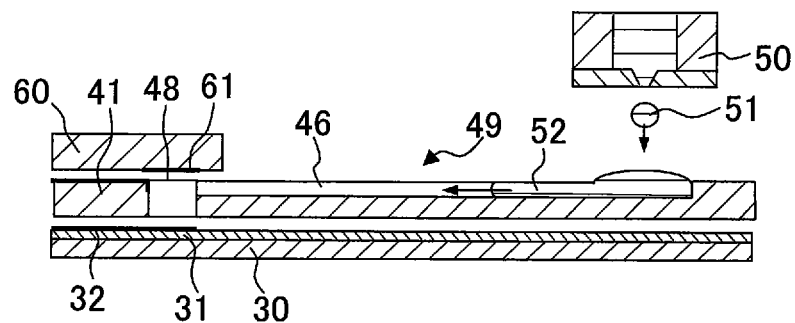

As described in the embodiment, the terminal of the driver IC and the individual electrode 32 may be connected electrically by electrically connecting the electroconductive material 43 to the terminal of the driver IC via the wire 42 formed on the upper surface of the substrate 41. As shown in FIG. 10A and FIG. 10B, a terminal 61 of a driver IC 60 is arranged on the upper surface of the substrate 41, at a position of an opening of the through hole 48. Here, by bringing a portion which is formed as a projection upward due to bulging due to the surface tension of the liquid 52 filled in the through hole 48, in contact with the terminal 61 of the driver IC 60, it is possible to connect electrically the terminal 61 of the driver IC 60 and the individual electrode 32 arranged on both surfaces of the substrate 41. In other words, it is possible to connect the terminal 61 of the driver IC arranged on the upper surface of the substrate 41 and the individual electrode 32 arranged on the lower surface of the substrate 41, without connecting by a wire. In this manner, by filling the liquid 52 in the through hole 48, it is possible to connect the terminal 61 of the driver IC arranged on the upper surface of the substrate 41 and the individual electrode 32 arranged on the lower surface of the substrate 41.

Fourth Modified Embodiment

Figure 11A:
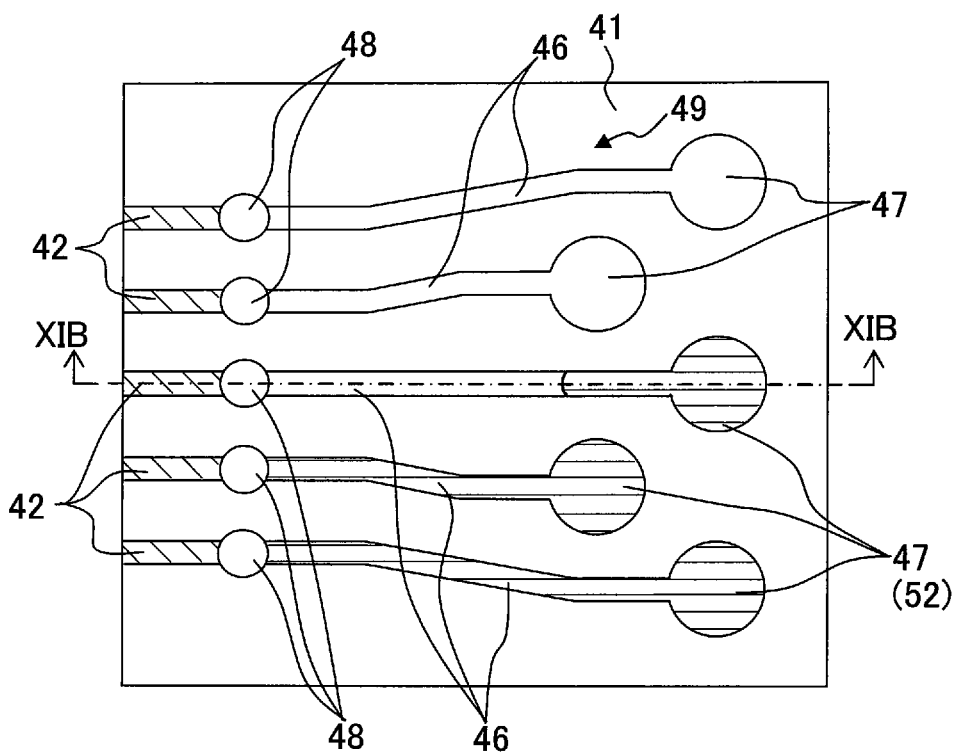
FIG. 11A and FIG. 11B are schematic diagrams corresponding to FIG. 7, of a fourth modified embodiment, where.
Figure 11B:
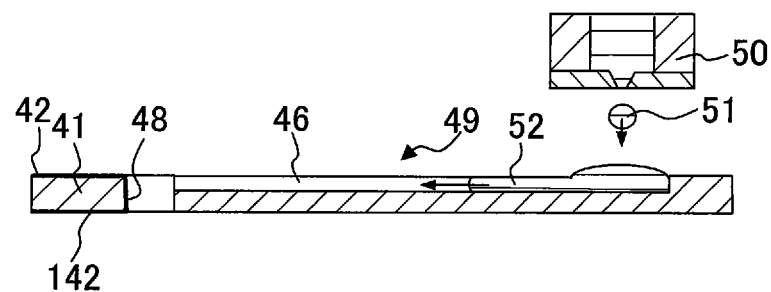

In the embodiment described above, the individual electrode 32 arranged on the lower surface of the substrate 41 and the wire 42 formed on the upper surface of the substrate 41 have been electrically connected via the liquid 52 filled in the through hole. However, instead of the individual electrode 32, a wire 142 may be formed on the lower surface of the substrate 41 as shown in FIG. 11. In this case, it is possible to connect the wire 142 formed on the lower surface of the substrate 41 and the wire 42 formed on the upper surface of the substrate 41 via the liquid 52 filled in the through hole 48 by connecting the wire 142 to a part of the periphery of the through hole 48.

Fifth Modified Embodiment

Figure 12A:
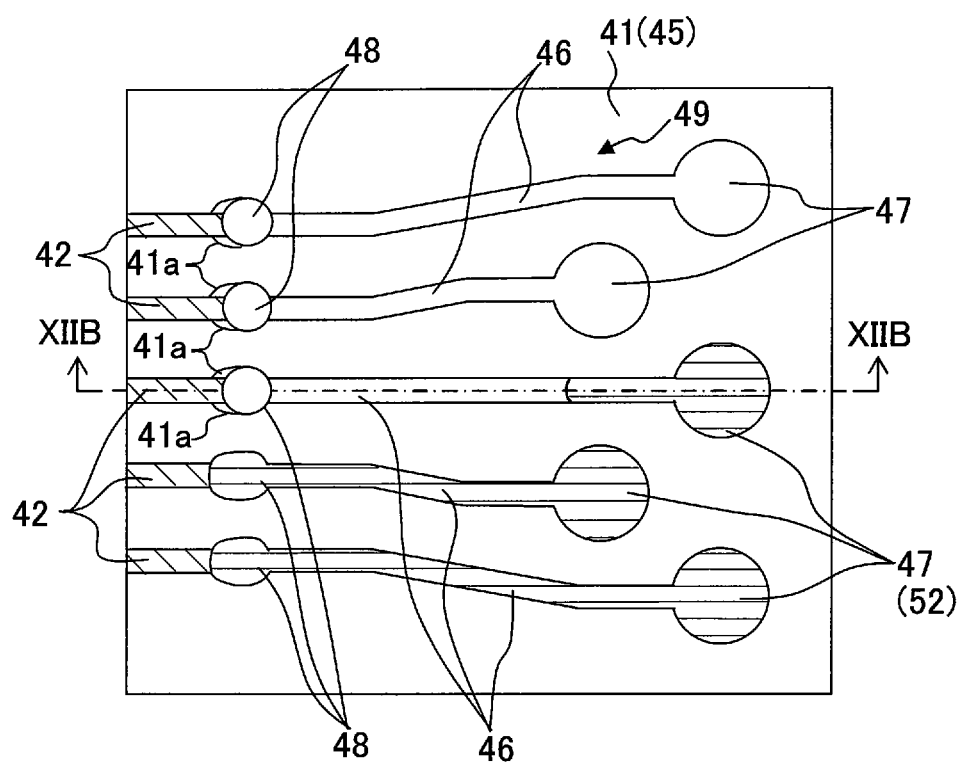
FIG. 12A and FIG. 12B are schematic diagrams corresponding to FIG. 7, of a fifth modified embodiment, where.
Figure 12B:
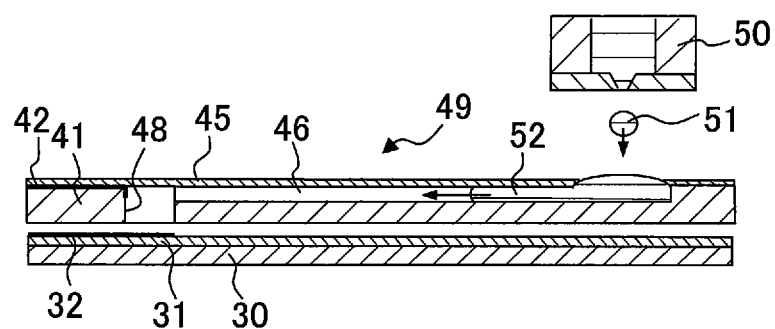

As shown in FIG. 12, a liquid repellent film 45 which is made of a fluororesin and which improves a liquid repellent property of the upper surface of the substrate 41, may be formed on the upper surface of the substrate 41. It is possible to carry out a step of forming this liquid repellent film 45 (liquid repellent film forming step) before the channel forming step. It is possible to form this liquid repellent film 45 by a method such as a spin coating method. Moreover, a notch 41a at which the surface of the substrate 41 is exposed is to be formed (may be formed) by removing the liquid repellent film 45 only near an end portion of a portion at which the through hole 48 and the wire 42 are connected. It is possible to form this notch 41a by removing the liquid repellent film 45 by irradiating a laser with a weak power. In this manner, with the liquid repellent film 45 formed on the substrate 41, there is a marked improvement in the liquid repellent property on the upper surface of the substrate 41 as compared to a state without the liquid repellent film 45, and it is possible to prevent assuredly the liquid 52 overflowing from the recess 47 and the groove 46. Further, as the liquid 52 is filled gradually in the through hole 48, the meniscus of the liquid rises from the opening of the through hole 48 due to the surface tension, and when the liquid 52 is filled further, the meniscus is destroyed and the liquid 52 is spread around the opening of the through hole 48. At this time, since the liquid repellent film 45 is not formed at the notch 41a of the substrate 41, the liquid repellent property at that portion is declined. Accordingly, the liquid 52 having the meniscus destroyed becomes susceptible to flow toward the wire 42, and to be adhered to an electroconductive pattern 132. In other words, it is possible to connect electrically the liquid 52 and the wire 42 assuredly.

Sixth Modified Embodiment

Figure 13A:
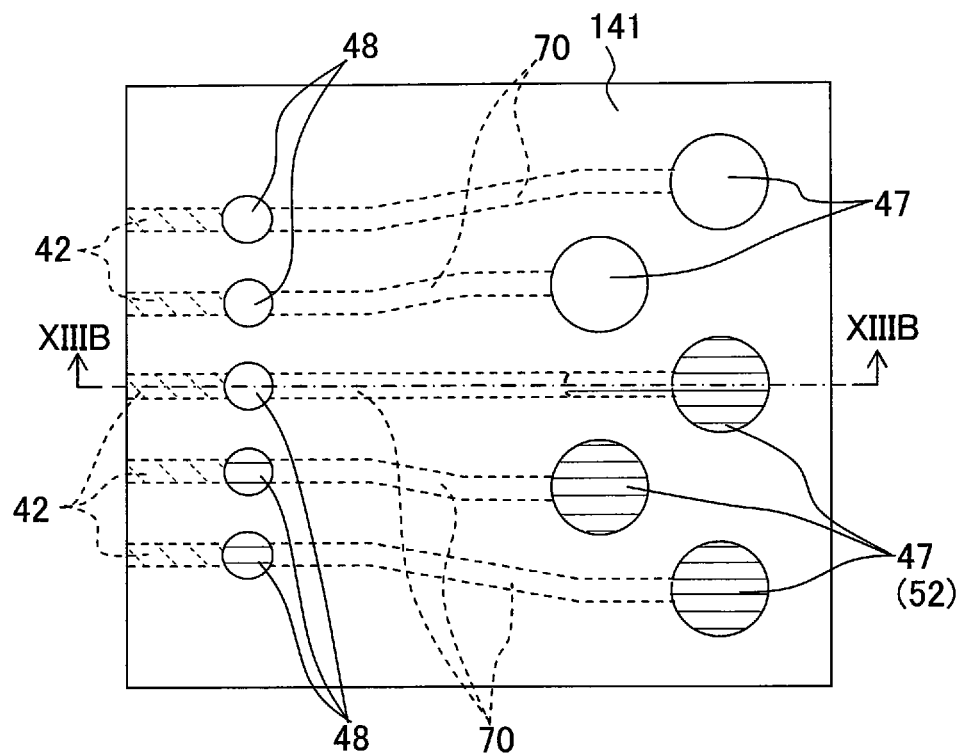
FIG. 13A and FIG. 13B are schematic diagrams corresponding to FIG. 7, of a sixth modified embodiment, where.
Figure 13B:
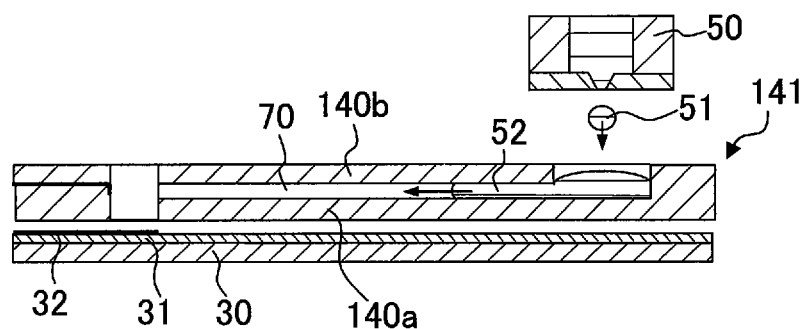

In the embodiment described above, the liquid 52 has been filled from the recess 47 to the through hole 48 via the groove 46 formed in the surface of the substrate 41. However, as shown in FIG. 13, an internal channel 70 which makes communicate an inner portion of the substrate 41 up to the through hole 48 from the recess 47 may be formed in a substrate 141, and the liquid may be filled in the through hole 48 from the recess 47 via this internal channel 70. In this case, the internal channel 70 is formed by forming a lower member 141a in which the recess 47, the through hole 48, and the groove are formed, and then arranging an upper member 141b to cover the groove. Accordingly, when the liquid droplet 51 landed on the recess 47 flows to the through hole 48 via the internal channel 70, the liquid droplet 51 does not overflow outside the substrate 41.

Seventh Modified Embodiment

Figure 14A:
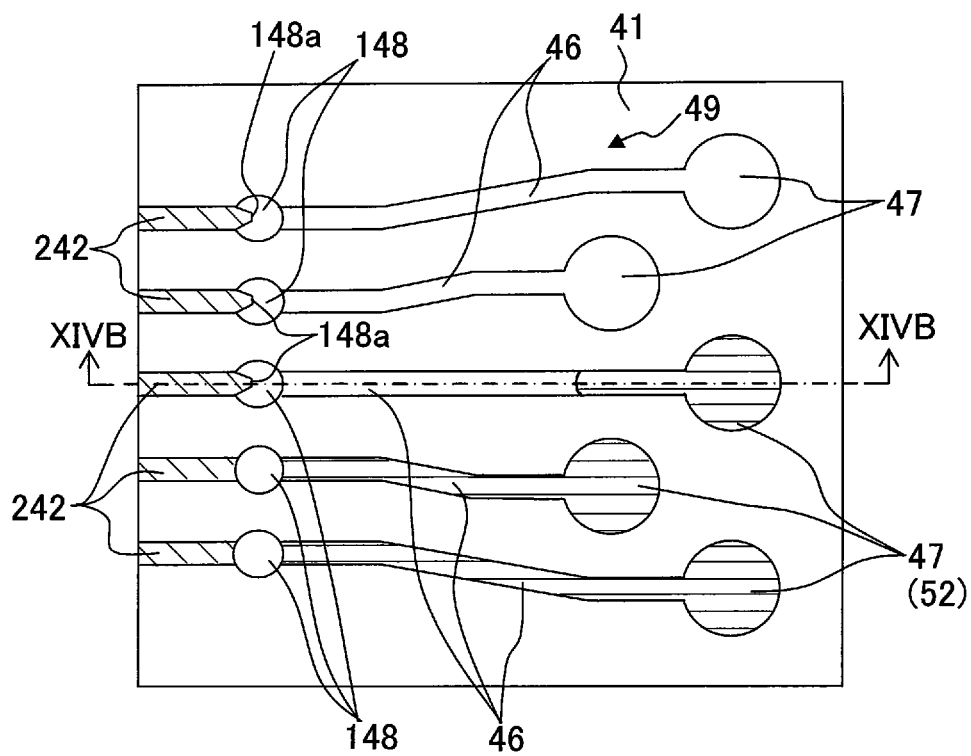
FIG. 14A and FIG. 14B are schematic diagrams corresponding to FIG. 7, of a seventh modified embodiment, where.
Figure 14B:
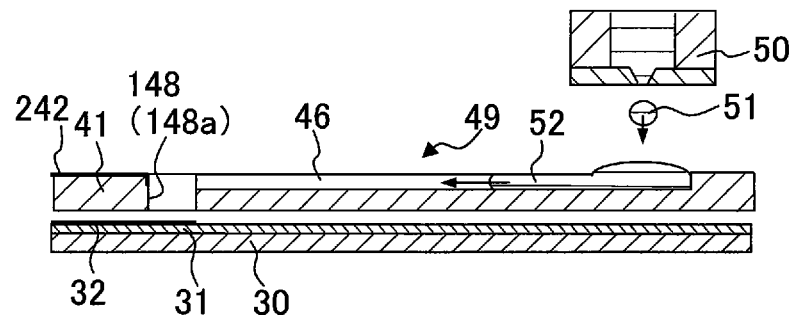

As shown in FIG. 14, a projection 148a projecting toward the center of the through hole 148 may be formed in the circumference portion of the substrate which defines the through hole and which has circular shape, and a wire 242 may be formed to cover a surface of the projection 148a. Accordingly, as the liquid 52 is filled gradually in a through hole 148, due to the surface tension thereof, a meniscus rises from an opening of the through hole 148, and when the liquid is filled further, the meniscus is destroyed at a front end of the projection 148a, and the liquid 52 is spread around the opening of the through hole 148. At this time, since the wire 242 is formed on a surface of the projection 148a, the liquid 52 having the meniscus destroyed at the projection 148a is adhered assuredly to the wire 242, and it is possible to connect electrically with the wire 242.

Eighth Modified Embodiment

Figure 15A:
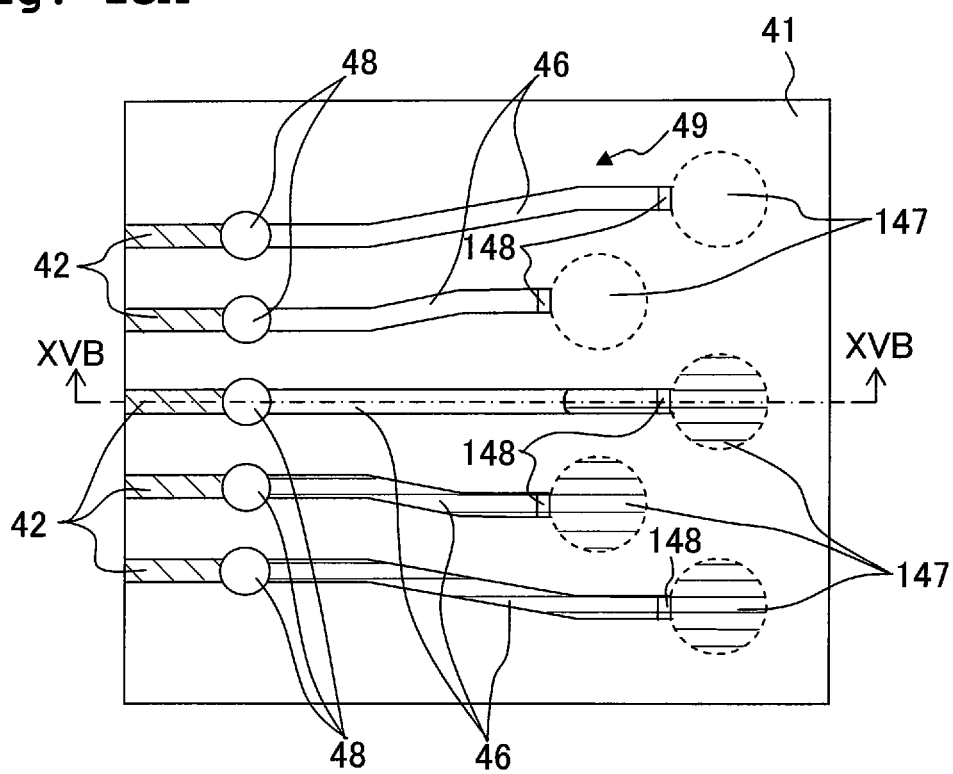
FIG. 15A and FIG. 15B are schematic diagrams corresponding to FIG. 7, of an eighth modified embodiment, where.
Figure 15B:
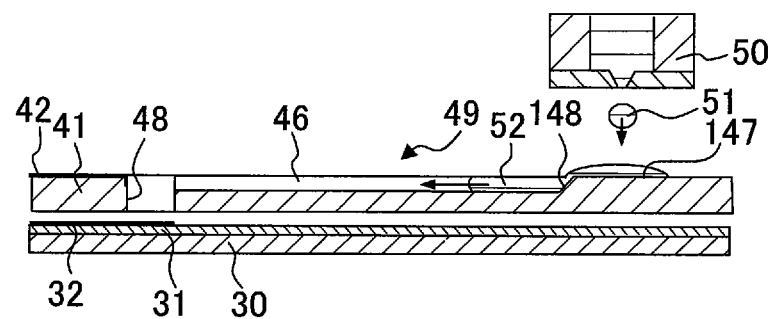

In the embodiment described above, the plurality of grooves 46 has been formed in the substrate 41, and the recess 47 communicates one end of each groove 46, and the electroconductive liquid 51 which is jetted from the liquid-droplet jetting apparatus 50 has been made to land on the recess 47. However, a location at which the liquid droplet 51 is to be made to land need not be the recess, and it may be another structure provided that it is possible to suppress wetting and spreading of the liquid droplet 51 that has landed, and to guide the liquid droplet to the groove 46. For example, as shown in FIG. 15, instead of the recess 47, there may be an area 147 which is on a same plane as a surrounding area of the area 147, and which is more susceptible to wetting as compared to the surrounding area, and the area 147 may be connected to the groove 46 via an inclined surface 148 which is susceptible to wetting similarly as the area 147. Accordingly, the liquid droplet 51 which has landed on the area 147 of the substrate 41 is not spread wetting the surrounding, and is sucked to the groove 46 via the inclined surface 148.

Ninth Modified Embodiment

The recess 47 need not necessarily have a circular shape in a plan view, and may be formed to have an arbitrary shape such as a rectangular shape, an elliptical shape, and a polygonal shape, provided that it is possible to secure an area which makes the liquid droplet 51 land assuredly.

Tenth Modified Embodiment

A cross-sectional shape of the groove 46 need not be necessarily a substantially rectangular shape, and it may be an arbitrary shape such as a semicircular shape and a triangular shape. Moreover, the width of the groove 46 may not be uniform, and a part of the groove may be formed to have more width (formed to be wider) for example.

Eleventh Modified Embodiment

In the embodiment described above, the recess 47 has been formed to have a diameter larger than the diameter of the liquid droplet 51 such that the liquid 52 filled in through holes 48 does not get shorted via the liquid 52 which is adhered to the surface of the substrate 41 without being landed on the recess 47. However, when the liquid 52 filled in the through holes 48 does not get shorted, or when the recess 47 is removed in the removing step, the recess 47 may be formed such that the diameter of the recess 47 is larger than the diameter of the liquid droplet 51.

Twelfth Modified Embodiment

Connecting objects such as wires and driver IC need not be necessarily arranged (arranging step) after forming the filling channel (filling channel forming step) and forming the through hole (through hole forming step), and an order of steps may be arbitrary. With the connecting objects arranged, the filling channel and the through hole may be formed, or the filling channel and the through hole may be formed before the liquid filling step, and then the connecting objects may be arranged.

Thirteenth Modified Embodiment

The embodiment is applicable not only to a case of connecting electrically the connecting objects which are arranged on/above both surfaces of the FPC 40 provided in the ink-jet printer 100, but also to a case of connecting electrically the connecting objects which are arranged on/above both surfaces of a substrate. In this case, the substrate is not restricted to be made of a flexible resin material such as the FPC 40, and may be made of a highly rigid ceramics material such as alumina and zirconia, or an insulating material (non-electroconductive material) such as a glass material.

Fourteenth Modified Embodiment

Figure 16A:
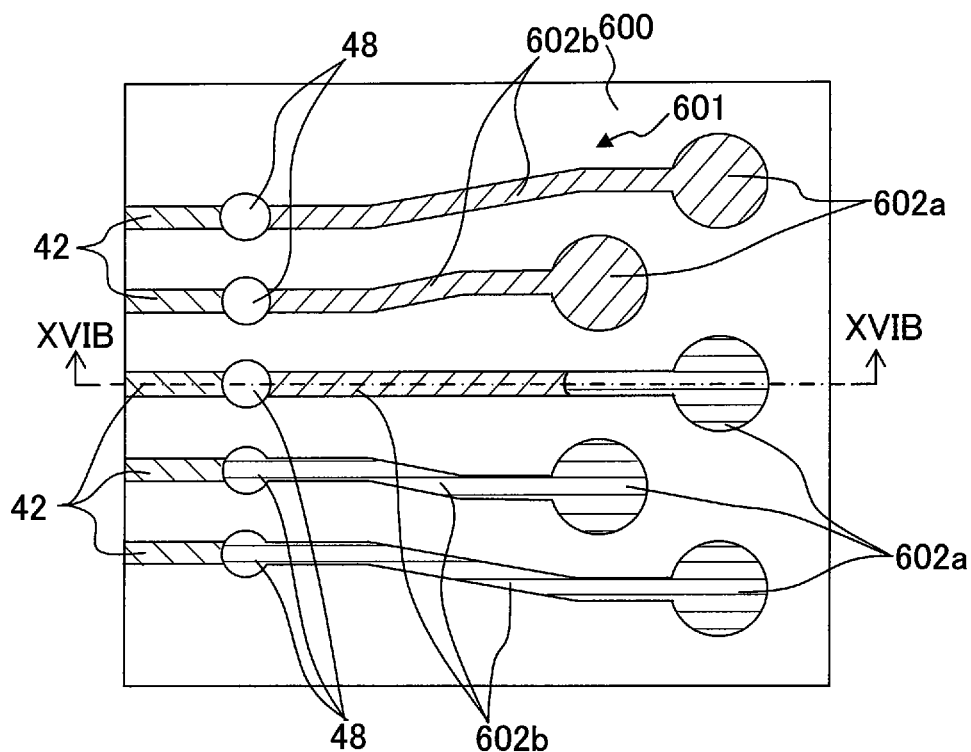
FIG. 16A and FIG. 16B are schematic diagrams corresponding to FIG. 7, of a fourteenth modified embodiment, where.
Figure 16B:
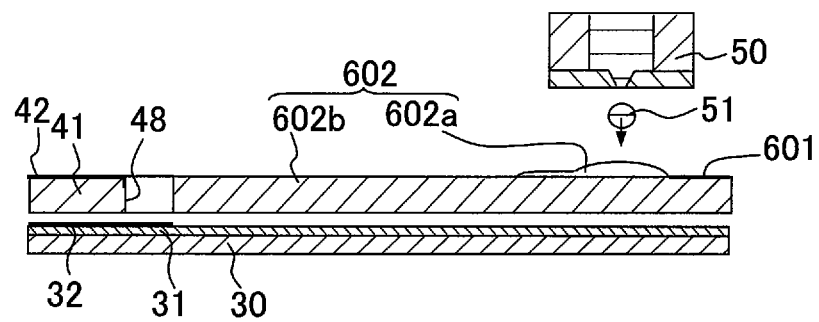

The filling channel may not necessarily have a recess and/or a groove. For example, a substrate 600 shown in FIG. 16 has a high liquid repellent property area 601 and a low liquid repellent property area 602 which is surrounded by the high liquid repellent property area 602, and the low liquid repellent property area 601 functions as the filling channel. Concretely, the low liquid repellent property area 602 has a plurality of liquid-receiving portions 602a having a substantially circular shape in a plan view, and a plurality of extending portions 602b each extending from the liquid-receiving portion 602a toward the through hole 48. An area around the liquid-receiving portion 602a and the extending portion 602b is surrounded by the high liquid repellent property area 601, or in other words, the liquid-receiving portion 602a and the extending portion 602b are defined by the high liquid repellent property area 601. Here, when a liquid droplet of the liquid 52 is made to land on the liquid-receiving portion 602a, the liquid 52 flows to the through hole 48 via the extending portion 602b having the low liquid repellent property. In this manner, the filling channel is not restricted to a groove etc. which guides the liquid to the through hole by using the capillary force. It is possible to form an area having a liquid repellent property remarkably lower than a liquid repellent property of a surrounding area, and to use this low liquid repellent property area as the filling channel. Here, by coating an entire surface of the substrate 600 by a material having a high liquid repellent property, such as a fluororesin, and thereafter, by irradiating a laser on the area to be the liquid-receiving portion 602a and the extended portion 602b, it is possible to form easily the high liquid repellent property area 601 and the low liquid repellent property area 602b. Since it is possible to remove the coating of the fluororesin and to make rough the surface of the substrate 600 by irradiating the laser, it is possible to form easily the low liquid repellent property area 602.

What is claimed is:
1. A method for connecting two objects electrically by an electroconductive liquid, comprising:
   providing a substrate having a first surface and a second surface which is opposite to the first surface with respect to a thickness direction of the substrate;
   forming a channel of the liquid on the first surface of the substrate to extend along the first surface of the substrate;
   forming a through hole in the substrate which communicates with the channel and defines openings on the first and second surfaces, respectively;
   forming, as one of the two objects, a wiring proximate to the first surface, wherein the wiring extends into an opening of the through hole;
   arranging the two objects such that the substrate interposes the two objects, wherein the two objects overlap with the openings of the through hole, respectively, as viewed in the thickness direction of the substrate;

filling the liquid to the through hole via the channel, by a capillary force or a surface tension between the liquid and a channel-defining surface;

bringing the liquid filled in the through hole in contact with the two objects; and hardening the liquid filled in the through hole, wherein, when bringing the liquid filled in the through hole in contact with the two objects, the liquid is supplied into the through hole, via the channel, until a surface of the liquid at an end opening of the through hole bulges to form a projection due to surface tension, and the projection of the surface of the liquid makes contact with one of the two objects.

2. The method for connecting two objects electrically according to claim 1, further comprising removing a region of the substrate, which includes a part of the channel, after filling the liquid in the through hole and bringing the liquid droplet into contact with the two objects.

3. The method for connecting two objects electrically according to claim 1, wherein upon forming the through hole in the substrate, a substrate projection which projects inwardly from an inner wall of the through hole is also formed together with the through hole; and the wiring is formed such that the wiring covers a surface of the substrate projection upon arranging the objects.

4. The method for connecting two objects electrically according to claim 1, wherein a liquid repellent property of a surface of the wiring is lower than a liquid repellent property of a surface of the substrate, at an area of the substrate different from another area at which the wiring is formed.

5. The method for connecting two objects electrically according to claim 1, wherein the channel is formed inside the substrate.

6. The method for connecting two objects electrically according to claim 1, wherein the channel is a groove formed on the first surface of the substrate.

7. The method for connecting two objects electrically according to claim 6, wherein a liquid repellent property of the first surface of the substrate is higher than a liquid repellent property of an inner surface of the liquid-receiving portion of the groove.

8. The method for connecting two objects electrically according to claim 7, further comprising forming a liquid repellent film on the first surface of the substrate before forming the channel, the liquid repellant film having a liquid repellent property higher than the liquid repellent property of the inner surface of the liquid-receiving portion of the groove.

9. The method for connecting two objects electrically according to claim 1, wherein one of the two objects is arranged to be away from the substrate upon arranging the two objects.

* * * * *